United States Patent [19]
Kenji et al.

[11] Patent Number: 5,712,515
[45] Date of Patent: Jan. 27, 1998

[54] POWER SOURCE ADAPTOR

[75] Inventors: Yokoyama Kenji; Ito Shin, both of Hamamatsu, Japan

[73] Assignee: Yamaha Corporation, Japan

[21] Appl. No.: 517,363

[22] Filed: Aug. 21, 1995

[30] Foreign Application Priority Data

Aug. 23, 1994 [JP] Japan .................. 6-221018

[51] Int. Cl.[6] .................................................. H01H 35/00
[52] U.S. Cl. .................. 307/126; 307/125; 307/134; 307/139; 307/141
[58] Field of Search ........................ 307/141, 125, 307/126, 134, 139, 140, 150, 119, 116; 323/318; 363/18, 15, 16; 200/329, 332.2, 330, 331, 332

[56] References Cited

U.S. PATENT DOCUMENTS

| | | | |
|---|---|---|---|
| 2,625,591 | 7/1953 | George | 361/601 |
| 3,562,595 | 2/1971 | Swanson et al. | 317/113 |
| 4,007,346 | 2/1977 | Gaigg | 200/148 |
| 4,012,617 | 3/1977 | Burke et al. | 219/10.55 B |
| 5,111,113 | 5/1992 | Chu | 315/210 |

*Primary Examiner*—William M. Shoop, Jr.
*Assistant Examiner*—Kim Lockett
*Attorney, Agent, or Firm*—Graham & James LLP

[57] ABSTRACT

A power source adaptor employing a small switch to securely and positively turn on and off the power source, and which can be detachably connected to an electrical apparatus. To avoid the cost and excessive size associated with prior art power source adaptors, the adaptor can include an auxiliary switch element provided for the control section of an electrical switching element to selectively start and stop a switching operation. A switch operating button on an adaptor housing operates the auxiliary switch element. An insulated coupling bar is also provided through which the switch operating button is mechanically coupled to the power on/off operating button on the apparatus body.

20 Claims, 2 Drawing Sheets

POWER SOURCE ADAPTOR

BACKGROUND OF THE INVENTION

1. Field of the Invention

This invention relates to a power source adaptor which is detachably connected to an electrical apparatus. More specifically, the invention relates to a power source adaptor and the electrical apparatus which use the power source adaptor.

2. Related Art

An electrical apparatus for use with a commercial AC power source generally includes a power switch connected to the AC line. When the power switch is turned off, the voltage of the AC line develops across the terminals of the power switch. Hence, for security, a power switch of this type generally must be high in dielectric strength. Accordingly, in many countries in the world, the use of power switches which are directly touched by users are subject to review and approval by an appropriate agency or group to ensure that only approved power switches are used.

A power switch such as those discussed above which are manufactured as an approved electrical component essentially serve to turn on and off an AC power source. Such switches typically incorporate relatively large distances between terminals in the switch. As a result, the components are undesirably large in size and are expensive to manufacture.

SUMMARY OF THE INVENTION

An object of the invention is to overcome the above and other problems associated with conventional power switches and to provide a power source adaptor employing a small switch to turn on and off a power source safely and positively, and which can be detachably connected to an apparatus having means for turning on and off a power source.

The foregoing and other objects of the present invention are achieved in a first embodiment by the provision of a power source adaptor which is detachably connected to an apparatus body having power on/off operating means. The power source adaptor includes a mechanical auxiliary switch element provided for the control section of an electrical switching element to selectively start and stop the operation of a switching power source circuit, and switch operating means, provided on a housing of the power source adaptor, for operating the mechanical auxiliary switch element. When the adaptor is connected to the apparatus body, the switch operating means is mechanically connected through insulated coupling means to the power on/off operating means of the apparatus body, so that the power on/off control is made on the side of the apparatus body.

In an another embodiment of the present invention, an electrical apparatus includes an apparatus body, and a power source adaptor is detachably connected to the apparatus body. A mechanical auxiliary switch element, which is connected to the control section of an electrical switching element to selectively start and stop the operation of a switching power circuit in the power source adaptor, is provided inside the apparatus body. Power on/off operating means for operating the mechanical auxiliary switching element is also provided on the apparatus body.

In the power source adaptor provided according to the various embodiments of the present invention, instead of an expensive power switch high in dielectric strength, a signal controlling mechanical switch element low in dielectric strength and small in size is employed, so that the power source is safely and positively turned on and off on the side of the apparatus body. In addition to a detachably connectible power source adaptor, an electrical apparatus can incorporate the novel power source adaptor according to the invention.

The above and other features and advantages of the present invention will become more readily apparent upon a reading of the detailed description of the present invention taken in conjunction with the drawings of which the following is a brief description. While the drawings illustrate the currently preferred embodiment of the present invention, it should be clear that the invention is in no way limited to the embodiment shown in the drawings. The present invention is solely limited by the claims which are appended to this specification.

DETAILED DESCRIPTION OF THE PREFERRED EMBODIMENTS

Figure 1:
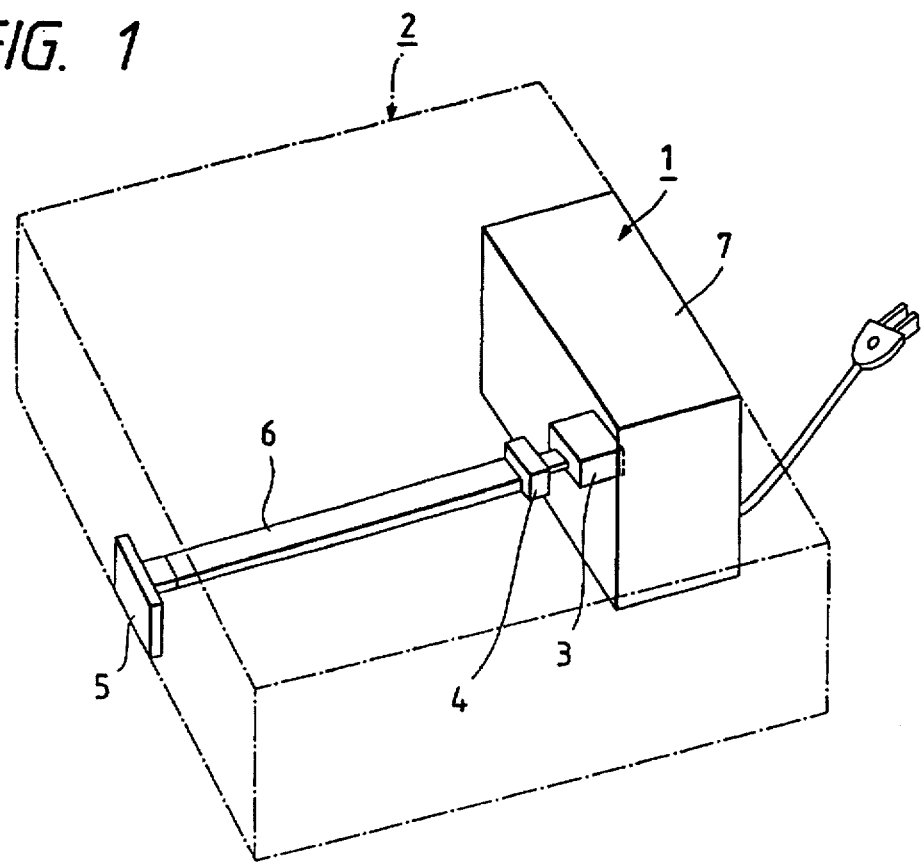
FIG. 1 illustrates a first embodiment of the power source adaptor of the present invention.

Preferred embodiments of the invention will be described with reference to the accompanying drawings. It should be understood that the present invention is in no way limited to the embodiments illustrated in the drawings. In the following discussion, like reference numbers refer to like elements.

Figure 2:
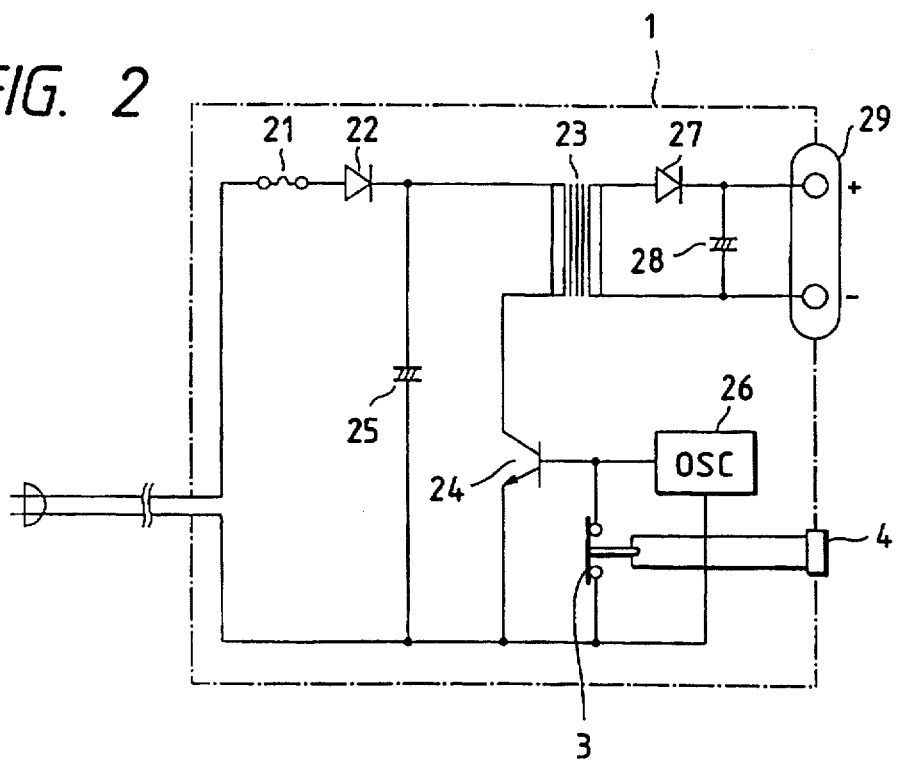
FIG. 2 is a schematic diagram showing an electrical circuit arrangement of the first embodiment.

FIG. 1 illustrates an arrangement of a power source adaptor in accordance with a first embodiment of the invention. FIG. 2 shows an internal electrical circuit of the power source adaptor. As shown in FIGS. 1–2, one conductor 8 of an AC power cable 9 is connected through a power fuse 21 and a primary rectifier circuit comprising a diode 22 and a capacitor 25 to one end of the primary winding of an insulating transformer 23. The other end of the primary winding is connected through a bipolar transistor 24 to the other conductor 10 of the AC power cable. The bipolar transistor 24 is adapted to start and stop a switching operation. An oscillating circuit 26 is connected to the base of the bipolar transistor 24 to control the operation of the transistor 24. The secondary output of the insulating transformer 23 is applied to a rectifying and smoothing circuit including a diode 27 and a capacitor 28, so that a DC output is provided at an output connector 29.

The transistor 24, which is an electrical switching element on a primary side of the switching power source circuit, has a mechanical auxiliary switch element 3. More specifically, the switch 3 is connected between the base and emitter of the transistor 24, to forcibly turn off the transistor 24. The auxiliary switch element 3 is designed for small power loads; in other words, it is a switch which is small in size and low in dielectric strength. An operating button 4 is provided on an adaptor housing 7, to turn on and off the auxiliary switch element 3.

The power source adaptor 1 of the first embodiment discussed above is detachably connected to a apparatus body 2. Power on/off means, for example, an operating button 5, is provided on the apparatus body 2. The operating button 5 is coupled through a coupling bar 6 to the power source adaptor 1 connected to the apparatus body 2. The coupling bar 6 is made of an electrically insulating material such as plastic so that it is high in dielectric strength.

As is apparent from the above description, the mechanical auxiliary switch element 3 of the power source adaptor 1 can be turned on and off by operating the power on/off operating button 5 on the side of the apparatus body 2.

In general, prior art power source adaptors which can be detachably connected to an electrical apparatus are turned on and off by connecting an AC power plug to, and disconnecting it from, the AC source. In the case where prior art power source adaptors are provided with an operating switch connected to an electrical apparatus, the switch generally cannot be used because of the design of the switch or because it is inconvenient. In the above-discussed embodiment of the invention, however, the auxiliary switch element 3 provided on the primary side of the power source adaptor 1, which is detachably connected to the electrical apparatus, can be readily turned on and off with the operating button 5 of the apparatus itself which is located on the body 2 of the apparatus, remote from the switch 3.

The auxiliary switch element 3 of the present invention may be small in size and low in manufacturing cost. That is, in the Switching power source circuit of the embodiment, the base-emitter voltage of the transistor 24, which is a primary switching element, is preferably less than 1V maximum, and usually about 0.6 volt. Accordingly, the voltage developed across the terminals of the auxiliary switch element 3 is less than 1V, and therefore the distance between the terminals of the element 3 may be extremely small. Further, the current switched by the auxiliary switch element 3 is also very small, being approximately $1/h_{FE}$ ($h_{EE}$: current amplitude facter) of the collector current. Thus, the auxiliary switch element 3 may be small in size and low in manufacturing cost.

In the above-discussed embodiment, the AC cable is not disconnected from the AC source when the operating button 5 of the apparatus is operated to turn off the supply of power to the apparatus. Hence, even when the power source is turned off, a small current flows in the primary rectifier circuit. However, the small current is of no concern since it is on the order of micro-amperes ($\mu A$).

Instead of a mechanical interlocking system for interlocking the power on/off operating button 5 of the apparatus body 2 with the auxiliary switch element 3 of the power source adaptor 1, an electrical interlocking system or an optical interlocking system may be employed. However, the electrical interlocking system is disadvantageous in that the operator may get an electric shock when the operator operates the electrical interlocking system due to low safety in the system. An optical locking system suffers from a problem that it is high in manufacturing cost because of the need for a light emitting source.

In the above-described embodiment, security can be obtained and manufacturing cost can be reduced by employment of the mechanical coupling bar 6 made of insulating material in order to couple the operating button 5 of the apparatus body 2 with the auxiliary switch element 3 of the power source adaptor 1.

Figure 3:
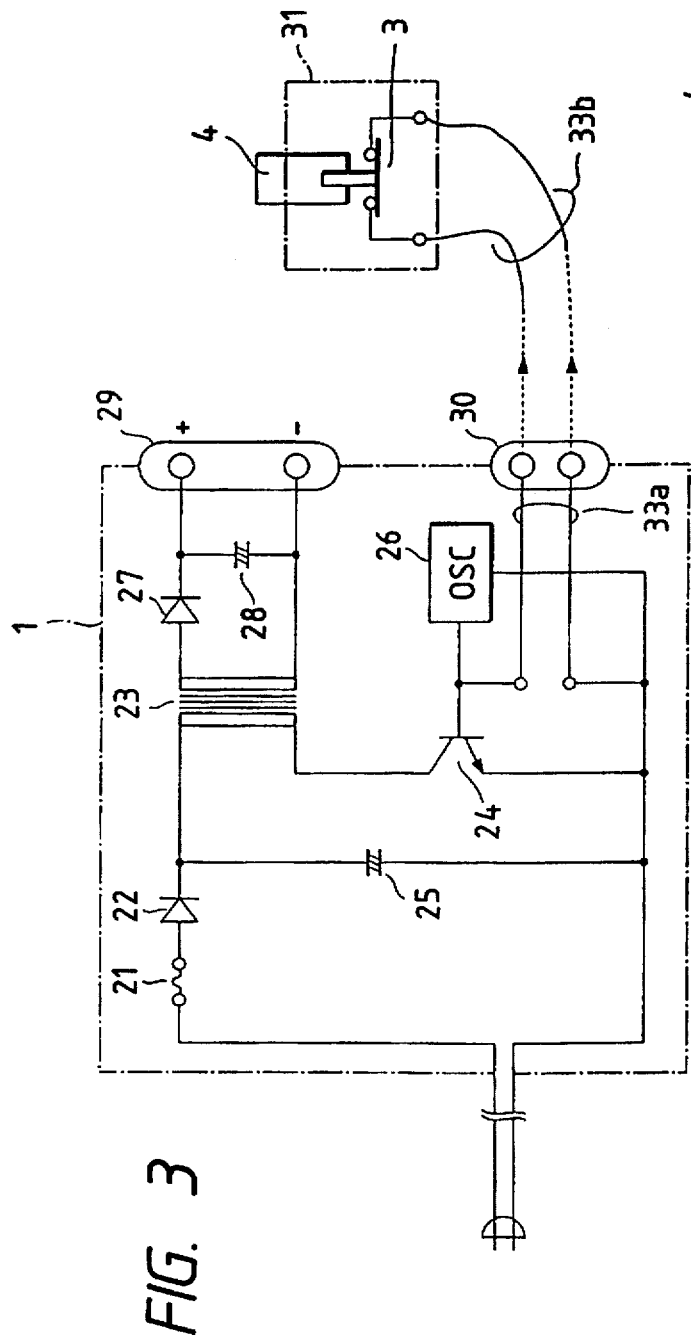
FIG. 3 is a schematic diagram showing an electrical circuit arrangement of a second embodiment of the invention.
Figure 4:
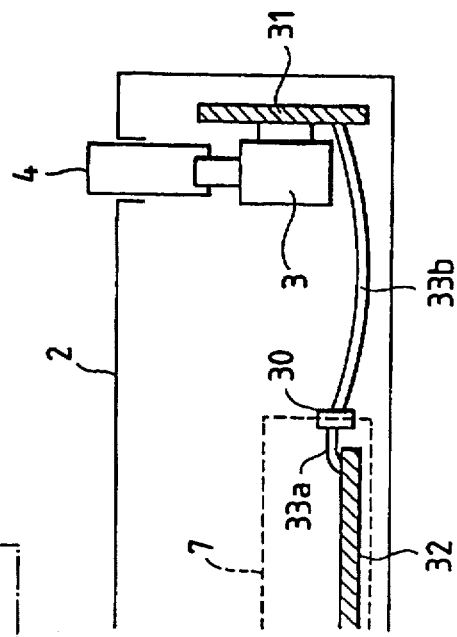
FIG. 4 is an explanatory diagram showing a mechanical arrangement of the second embodiment.

FIGS. 3 and 4 illustrate a second embodiment of the invention, in which parts corresponding functionally to those of the first embodiment are designated with like reference numerals or characters.

In the first embodiment, the mechanical auxiliary switch element 3 is provided inside the power source adaptor 1. On the other hand, in the second embodiment, the mechanical auxiliary switch element 3 is provided outside the power source adaptor 1.

The power source adaptor 1 has an electrical connector 30 in addition to the output connector 29. The connector 30 is electrically connected between the base and emitter of the switching transistor 24 in the power source adaptor 1 when the power source adaptor 1 is connected to the apparatus body 2.

The operating button 4 of the auxiliary switch element 3 is an insulated knob. The end portion of the operating button 4 is exposed above the apparatus body 2 as shown in FIG. 4. In the second embodiment, the operating button 4 serves also as the power on/off operating button 5 of the above-described first embodiment. That is, in the second embodiment, the auxiliary switch element 3 is separated from the power source adaptor 1, and is arranged inside the apparatus body 2, so that the switch operating button 4 also serves as the power on/off operating button 5. Hence, in the second embodiment, the coupling bar 6 of the first embodiment is eliminated.

As shown in FIGS. 3 and 4, a substrate 32 is provided inside the adaptor housing 7 and is coupled through the electrical connector 30 to the switching mounting substrate 31 in the apparatus body. More specifically, in addition to the substrate 32 provided in the housing 7 of the power source adaptor 1, a substrate 31 is provided in the apparatus body 2, and the auxiliary switch element 3 is mounted on the substrate 32. The circuit components comprising the power source adaptor 1 are mounted to the substrate 32. The adaptor 1 is generally connected to the apparatus body 2 and cords 33a, 33b, which are connected through connector 30, may be used to electrically connect the power source adaptor circuit on substrate 32 to the switch 3 mounted on substrate 31. In addition, the connector 30 may be eliminated and a single cord may be used to connect the substrate 32 provided inside the adaptor housing to the switch mounting substrate 31 in the apparatus body.

The second embodiment, similar to the first embodiment, employs the small mechanical auxiliary switch element 3 so that the on-off control of the power source adaptor 1 connected to the electrical apparatus is safely and positively performed on the side of the electrical apparatus 2.

The switching power source discussed above may be applied to a self-exciting type or a separately exciting type. In the case where the switching power source is a separatly exciting type which has an own oscillator, independently, the auxiliary switch element may be any one that is able to turn on and off the oscillation of the oscillator.

As is apparent from the above description, the power source adaptor of the invention employs a mechanical auxiliary switch element low in dielectric strength and small in size. As such, the power source can be safely and positively turned on and off on the apparatus body to which the power source adaptor is connected. In addition, an electrical device can incorporate the power source adaptor according to the invention as described above, thus eliminating the need for an external power source adaptor.

While the above disclosure is of the currently preferred embodiments of the present invention, the invention is in no way limited to the specific embodiments discussed. One skilled in the art of power source adaptor will readily recognize that numerous modifications, additions, and/or substitutions may be made to the preferred embodiments without departing from the spirit and scope of the present invention. It is intended that all such modifications, substitutions and/or additions be encompassed within the scope of the present invention. The invention is solely limited by the claims which appear below.

What is claimed is:

1. A power source adaptor which is detachably connected to an apparatus including power on/off operating means for controlling a supply of power to the apparatus, said power source adaptor comprising:

a power source circuit including an electrical switching element;

a mechanical switch provided for starting and stopping an operation of the electrical switching element;

switch operating means provided on an adaptor housing, for operating said mechanical switch;

coupling means for coupling said switch operating means with said power on/off operating means, said coupling means being electrically insulated, wherein when said adaptor is connected to said apparatus, power to the adaptor is controlled by the power on/off operating means.

2. An electrical apparatus having an apparatus body, and a power source adaptor detachably connected to said apparatus body, said power source adaptor including a switching power circuit and an electrical switching element for selectively starting and stopping operation of said switching power circuit, said apparatus comprising:

a mechanical switch connected to said electrical switching element and operative to selectively start and stop operation of said switching power circuit in said power source adaptor, said mechanical switch being provided inside said apparatus body; and power on/off operating means for controlling said mechanical switch, said power on/off operating means being provided on an exterior surface of said apparatus body.

3. A power source adaptor comprising:

switching means for switching a power source circuit;

switch operating means, operatively coupled with said switching means, for controlling operation of said switching means;

coupling means for coupling said switch operating means with an external power switch; and output means for providing a supply of output power from said power source circuit;

wherein said external power switch controls said switch operating means.

4. A power source adaptor as in claim 3, wherein said coupling means is electrically insulated such that, when said adaptor is connected to an electrical apparatus, said switch operating means is mechanically connected through said insulated coupling means to said external power switch so that power on/off control is made on a side of said apparatus.

5. A power source adaptor as in claim 3, wherein said power source circuit includes:

a transformer having a primary winding and secondary winding;

a rectifier circuit connected with said primary winding; and an AC power supply cable, electrically connected with said switching means and said rectifier for supplying AC power to said power source circuit.

6. A power source adaptor as in claim 5, wherein said switch means is operative to electrically connect said AC power supply cable and said primary winding of said transformer, said switch operating means selectively controlling said switch means to at least one of electrically connect and disconnect said AC power supply cable and said primary winding, thereby controlling the supply of power from said output means.

7. A power source adaptor as in claim 6, further including means for detachably coupling said power source adaptor with said apparatus, wherein said output means provides a supply of output power to said apparatus.

8. A power source adaptor as in claim 7, wherein said apparatus includes power on/off operating means for controlling a supply of power to the apparatus, said power source adaptor including means for operatively coupling said power on/off means and said switch operating means.

9. A power source adaptor as in claim 3, wherein said switching means comprises a transistor.

10. A power source adaptor as in claim 9, wherein said switch operating means comprises a switching member.

11. A power source adaptor as in claim 10, wherein the transistor includes a base and an emitter, and said switching member is connected between the base and emitter.

12. A power source adaptor according to claim 11, further including means for detachably coupling said power source adaptor with an electrical apparatus, and means for operatively coupling said external power switch with a power on/off switch disposed on said apparatus for controlling a supply of power to said apparatus, wherein said output means provides the supply of output power to said apparatus.

13. A power source apdptor according to claim 12, wherein said coupling means comprises an electrically insulated coupling member for operatively coupling said switching member with said external power switch.

14. A power source adaptor according to claim 13, further including a housing for containing the power source adaptor.

15. A power source adaptor according to claim 14, wherein said switch operating means is disposed inside said housing.

16. A power source adaptor according to claim 14, wherein said switch operating means is disposed external to said housing.

17. A power source adaptor according to claim 16, wherein said switch operating means comprises a switching member.

18. A power source adaptor according to claim 17, further including means for detachably connecting said power source adaptor with an electrical apparatus, said housing being detachably connected at a first location on said apparatus and said switch operating means being detachably connected at a second location on said apparatus.

19. A power source adaptor according to claim 18, further including external means for operating said switch operating means from a position external to said electrical apparatus.

20. A power source adaptor according to claim 19, wherein said external means includes an insulated knob.

* * * * *